US010170643B2

United States Patent
Lee et al.

(10) Patent No.: US 10,170,643 B2
(45) Date of Patent: Jan. 1, 2019

(54) METHOD FOR MANUFACTURING BARRIER FILM WITH ENHANCED MOISTURE RESISTANCE AND BARRIER FILM MANUFACTURED BY THE SAME

(71) Applicants: Hyundai Motor Company, Seoul (KR); Industry-Academic Cooperation Foundation, Yonsei University, Seoul (KR)

(72) Inventors: Ji Yong Lee, Suwon-si (KR); Jeong Woo Park, Seoul (KR); Hyun Jae Kim, Seoul (KR)

(73) Assignees: Hyundai Motor Company, Seoul (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/397,578

(22) Filed: Jan. 3, 2017

(65) Prior Publication Data

US 2018/0102439 A1    Apr. 12, 2018

(30) Foreign Application Priority Data

Oct. 6, 2016 (KR) ........................ 10-2016-0129176

(51) Int. Cl.
*H01L 21/00* (2006.01)
*H01L 31/0203* (2014.01)
*C23C 14/08* (2006.01)
*C23C 14/10* (2006.01)
*C23C 14/34* (2006.01)
*C23C 16/40* (2006.01)
*C23C 16/455* (2006.01)
(Continued)

(52) U.S. Cl.
CPC ........ *H01L 31/0203* (2013.01); *C23C 14/083* (2013.01); *C23C 14/10* (2013.01);
(Continued)

(58) Field of Classification Search
CPC .......... H01L 31/0203; H01L 21/02266; H01L 21/0228; H01L 31/0481
See application file for complete search history.

(56) References Cited

U.S. PATENT DOCUMENTS 5,786,605 A * 7/1998 Gwin .................. H01L 21/2255
                                                257/101
5,940,692 A * 8/1999 Jeng .................... H01L 29/6656
                                                257/E29.266
(Continued)

FOREIGN PATENT DOCUMENTS

JP    2014-148753 A    8/2014
JP    2014-151571 A    8/2014
(Continued)

OTHER PUBLICATIONS

Kim et al., "Effect of Nitrous Oxide High Pressure Annealing on the Performance of Low Temperature, Soluble-Based IZO Transistors", IEEE Electron Device Letters, vol. 35, No. 4, Apr. 2014, pp. 455-457.*

(Continued)

*Primary Examiner* — Richard A Booth
(74) *Attorney, Agent, or Firm* — Morgan, Lewis & Bockius LLP

(57) ABSTRACT

A barrier film and a method of manufacturing the barrier film are provided. The method includes performing high-pressure thermal treatment under certain conditions on an oxide thin film deposited by sputtering deposition or atomic layer deposition (ALD) to manufacture a barrier film with improved moisture resistance. According to the method, moisture resistance of the barrier film can be improved at a low process temperature by using both thermal energy and pressure energy. The barrier film provided herein can be useful as a barrier film for solar cells.

2 Claims, 2 Drawing Sheets

$SiO_2$ (150 nm) + $ZrO_2$ (10 nm) - sputtering

(51) Int. Cl.
    *C23C 16/56*     (2006.01)
    *H01L 21/02*     (2006.01)
    *H01L 31/048*     (2014.01)
    *C23C 14/58*     (2006.01)

(52) U.S. Cl.
    CPC ...... *C23C 14/3464* (2013.01); *C23C 14/5806* (2013.01); *C23C 16/40* (2013.01); *C23C 16/403* (2013.01); *C23C 16/45525* (2013.01); *C23C 16/45555* (2013.01); *C23C 16/56* (2013.01); *H01L 21/0228* (2013.01); *H01L 21/02266* (2013.01); *H01L 31/0481* (2013.01)

(56) References Cited

U.S. PATENT DOCUMENTS

2002/0197789 A1* 12/2002 Buchanan ......... H01L 21/02178
                                                                        438/240
2011/0177327 A1    7/2011  Jahromi et al.

FOREIGN PATENT DOCUMENTS

| KR | 2002-0092284 A | 12/2002 |
|---|---|---|
| KR | 10-2008-0009532 A | 1/2008 |
| KR | 10-2014-0009427 A | 1/2014 |
| KR | 10-2016-0064012 A | 6/2016 |
| WO | WO 2008/059925 A1 | 5/2008 |
| WO | WO 2016/054531 A1 | 4/2016 |

OTHER PUBLICATIONS

Yoshitsugu et al., "Effect of High-Pressure Deuterium Oxide Annealing on Al2O3 Deposited by Plasma-Assisted Atomic Layer Deposition at Low Temperatures", 2012, IEEE, pp. 1-2.*

Houssa et al., "Effect of O2 post-deposition anneals on the properties of ultra-thin SiOx/ZrO2 gate dielectric stacks", Semiconductor Science and Technology 16 (2001), pp. 31-38.*

* cited by examiner

SiO₂ (150 nm) + ZrO₂ (10 nm) – sputtering

Al₂O₃ (70 nm) – ALD

ZrO₂ 10 nm / SiO₂ 150 nm

Al₂O₃ 70nm

METHOD FOR MANUFACTURING BARRIER FILM WITH ENHANCED MOISTURE RESISTANCE AND BARRIER FILM MANUFACTURED BY THE SAME

CROSS-REFERENCE TO RELATED APPLICATION

This application claims under 35 U.S.C. § 119(a) benefit to Korean Patent Application No. 10-2016-0129176, filed on Oct. 6, 2016, the entire contents of which are incorporated herein by reference for all purposes.

BACKGROUND

Technical Field

The present disclosure relates to a method of manufacturing a barrier film which includes depositing an oxide thin film on a substrate in a deposition manner as determined depending on the type of oxide and high-pressure thermal treating the thin film at a predetermined temperature and at a predetermined pressure. The thin film described herein can be manufactured at a low temperature, at a low cost and at a high yield. The moisture resistance of the barrier film can be improved, and transmittance can be 90% or more, as compared to a conventional method of manufacturing a barrier film by thermal treatment. The present invention also relates to a barrier film manufactured by the method.

Background Art

Electric cars are beginning to replace petroleum cars and the market has explosively grown and been led by various automobile companies.

For example, Tesla has about 249 published patents, yet a relatively small portion (about (35) are related to electric charging technology. Currently, charging of electric cars is performed by charging stations operated by global electric car companies and chargers for home use. There are advantages of combining electric cars with solar cell technologies.

However, solar cell charging systems have low efficiency and limited lifetime as compared to conventional systems. Accordingly, there is a need for prevention of deterioration in device efficiency and improvement of lifespan based on development of solar cell barrier films.

Inorganic films used as conventional barrier films in solar cells function as excellent barrier layers to osmosis, but have a problem of allowing permeation of moisture or oxygen due to physical defects such as pinholes and pore regions. Organic films have a problem of relatively high permeation when moisture or oxygen adsorbed on the surfaces of the films is permeated by diffusion. There was a lot of conventional research on improvement of moisture resistance by increasing substantial permeation movement routes using an organic/inorganic hybrid structure to solve these drawbacks of organic/inorganic substances. In addition, recently, use of graphene is receiving much attraction as a next-generation novel substance, as a barrier film has been attempted due to gas barrier properties and thin thickness, and technologies associated the use are thus developed.

In this regard, conventional barrier films using oxide thin films have been produced by vacuum deposition such as physical vapor deposition (PVD), chemical vapor deposition (CVD) and atomic layer deposition (ALD), and conventional research was focused on improvement of moisture resistance of barrier films by changing the type of materials, conditions and the like, rather than processes. In addition, oxide thin films formed by such a process had a limitation of needing additional high-temperature thermal treatment to improve properties thereof.

Furthermore, conventional hybrid barrier films are produced by PVD, CVD and the like as well as processes such as solution casting and blending. Such a production process has an economic problem of low mass-production efficiency due to a complicated multilayer stacking process. In addition, these processes are conducted at high temperatures for chemical bonding of thin films. These processes are inapplicable to flexible substrates having a low melting point. There are some flexible substrates having a high melting point. However, such substrates have a problem of a high production cost. In addition, barrier films using graphene are commercially unavailable because of technical difficulty in producing large-area graphene single layers.

Accordingly, the present invention provides a barrier film which is produced at low costs and high yield, exhibits excellent moisture resistance and high transmittance and is useful for packaging solar cells, and a method of producing the same. The barrier film can improve charge efficiency and lifespan of solar cells of electric cars. Such barrier films with improved moisture resistance can be used to establish electric car charging systems using solar cells.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention has been made in an effort to solve the above-described problems associated with the prior art.

Accordingly, the present invention is based, in part, on the discovery that a barrier film can be manufactured at a low temperature, at a low cost and at a high yield, moisture resistance is improved, and transmittance is 90% or more, as compared to a conventional method of manufacturing a barrier film by thermal treatment. The method of the prevention includes depositing an oxide thin film on a substrate in a deposition manner as determined depending on the type of oxide and high-pressure thermal-treating the thin film at a predetermined temperature and at a predetermined high pressure.

In one aspect, the present invention provides a method of manufacturing a barrier film that includes manufacturing the barrier film at a low temperature at a low cost and at a high yield, and thus producing a barrier film with improved transmittance and moisture resistance.

In another aspect, the present invention provides a barrier film manufactured by the method outlined herein.

In one aspect, the present invention provides a method of manufacturing a barrier film with improved moisture resistance. The method includes: (a) forming an oxide thin film on a substrate by deposition and (b) thermally treating the oxide thin film using $N_2$, $O_2$ or a mix gas thereof at a temperature of from about 50 to 500° C. and at a high pressure of from about 10 to 50 atm.

In addition, the present invention provides a barrier film for packaging a solar wherein the barrier film is manufactured by the method described above.

Other aspects and preferred embodiments of the invention are discussed infra.

BRIEF DESCRIPTION OF THE DRAWINGS

The above and other features of the present invention will now be described in detail with reference to certain exem

Figure 1A:
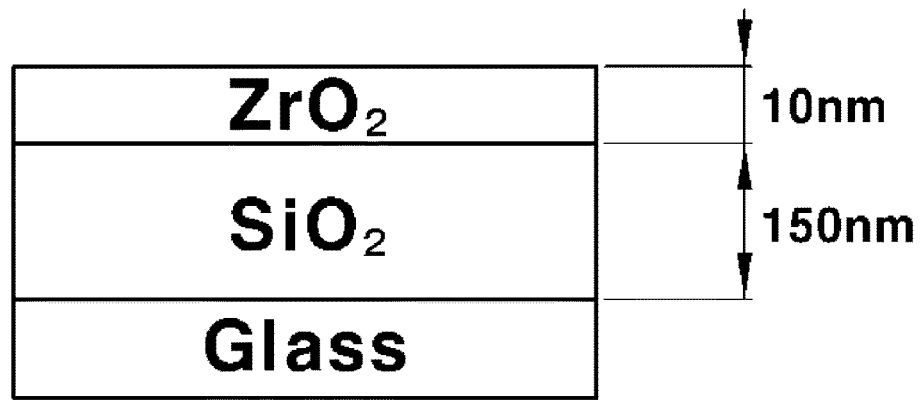
- FIG. 1(a) is a sectional view illustrating a barrier film produced in Example 1 and FIG. 1(b) is a sectional view illustrating a barrier film produced in Example 4.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, an embodiment of the present invention will be described in detail.

In order to manufacture a barrier film with excellent moisture resistance according to the present invention, high-pressure thermal treatment is further conducted on an oxide thin film deposited by sputtering deposition or atomic layer deposition (ALD).

In some aspects, the present invention provides a method of manufacturing a barrier film with improved moisture resistance including: (a) forming an oxide thin film on a substrate by deposition; and (b) thermally treating the oxide thin film using $N_2$, $O_2$ or a mix gas thereof at a temperature of from about 50 to 500° C. (e.g., about 50° C., 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, or about 500° C.) and at a high pressure of from about 10 to 50 atm (e.g., about 10 atm, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or about 50 atm).

In Step (a), an oxide thin film is formed on a substrate by deposition. The substrate may be a polyamide substrate. In some embodiments, the deposition may be carried out using sputtering deposition or atomic layer deposition (ALD) depending on the type of oxide.

Figure 1B:
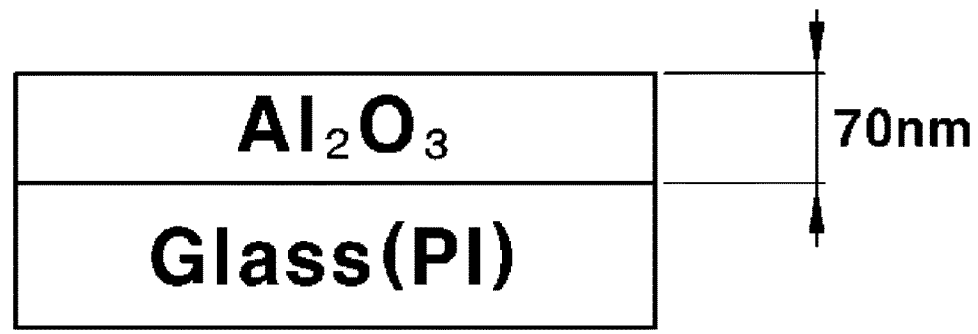

In certain embodiments, the oxide thin film may be a multi-layered thin film made of $SiO_2$ and $ZrO_2$ on the substrate (e.g., as in FIG. 1(a)), or a monolayer thin film made of $Al_2O_3$ (e.g., as in FIG. 1(b)).

In some embodiments, the multilayer thin film is formed by sequentially depositing $SiO_2$ and $ZrO_2$ on a substrate by sputtering deposition, whereas the monolayer thin film is formed by depositing $Al_2O_3$ on a substrate by atomic layer deposition (ALD).

In a case of a multilayer thin film in which $SiO_2$ and $ZrO_2$ thin films are laminated, moisture resistance may be reduced due to high defect density of oxide thin films. For this reason, an ALD-based $Al_2O_3$ monolayer thin film with excellent thin film qualities is more preferably used.

In some instances, the deposition is carried out such that the $SiO_2$ layer has an average thickness of from about 100 to 200 nm (e.g., about 100 nm, 110, 115, 120, 125, 130, 135, 140, 145, 150, 155, 160, 165, 170, 175, 180, 185, 190, 195, or about 200 nm), the $ZrO_2$ layer has an average thickness of from about 5 to 15 nm (e.g., about 5, 6, 7, 8, 9, 10, 11, 12, 13, 14, or 15 nm) and the $Al_2O_3$ layer has an average thickness of 50 to 100 nm (e.g., about 50 nm, 51, 52, 53, 54, 55, 56, 57, 58, 59, 60, 65, 70, 75, 80, 85, 90, 91, 92, 93, 94, 95, 96, 97, 98, 99, or about 100 nm).

When the thickness of the $SiO_2$ layer is less than 100 nm or exceeds 200 nm, thin films have limited transparency and moisture resistance, and when the thickness of the $ZrO_2$ layer is less than 5 nm or exceeds 15 nm, thin films have limited transparency and moisture resistance. Accordingly, the deposition is preferably carried out within the range defined above. In addition, similarly, when the thickness of the $Al_2O_3$ layer is less than 50 nm or exceeds 100 nm, thin films have limited transparency and moisture resistance. Accordingly, the deposition is preferably carried out within the range defined above. In general, an $Al_2O_3$ thin film formed by atomic layer deposition (ALD) can be produced by deposition at a relatively low temperature of 100° C. Accordingly, there are advantages in that a thin film with high quality can be obtained even at a lower temperature, as compared to thin films including $SiO_2$ and $ZrO_2$ and flexible substrates can be easily used due to relatively low process temperature.

Next, in Step (b), the thin film obtained in Step (a) is thermally treated using $N_2$, $O_2$ or a mix gas thereof at a temperature of from about 50 to 500° C. (e.g., about 50° C., 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, or about 500° C.) and at a high pressure of 10 to 50 atm (e.g., about 10 atm, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or about 50 atm).

In general, a high-temperature thermal energy process is needed to improve properties of an oxide thin film formed by sputtering deposition or atomic layer deposition (ALD).

However, such high-temperature thermal treatment causes problems of increased process costs and restriction to use flexible substrates with a relatively low melting point. In conventional cases, simple high-temperature thermal treatment was conducted as a post-treatment process. On the other hand, according to the present invention, moisture resistance of barrier films can be improved at a low process temperature by using both thermal energy and pressure energy due to high-pressure thermal treatment.

The effects of high-pressure thermal treatment in the present invention may be classified into two effects, i.e., pressure effect and gas effect. In this case, the pressure effect means that pressure is used as a thermal energy source to re-bond weak bonds inside the oxide thin film. The gas effect means that, among used $N_2$, $O_2$ or a mix gas thereof, nitrogen, an inert gas, functions to reduce unnecessary reaction inside the thin film and oxygen functions to reduce oxygen vacancy or defects inside the thin film.

Based on these two effects, it can be expected that physical defects in conventional thin films are reduced by high-temperature gas and overall uniformity and density of thin films are improved. Consequently, defect density inside thin films is reduced and moisture resistance can thus be improved.

In this case, the high-pressure thermal treatment is preferably carried out using $N_2$, $O_2$ or a mix gas thereof under the conditions including a temperature of from about 50 to 500° C. (e.g., about 50° C., 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, or about 500° C.) and a pressure of from about 10 to 50 atm (e.g., about 10 atm, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or about 50 atm) for from about 30 minutes to 3 hours (e.g., about 30 minutes, 45 minutes, 1 hour, 1.5, 2, 2.5, or about 3 hours). When the temperature is lower than 50° C., there is a limit on improvement of the pressure effect by high-pressure thermal treatment due to low diffusion rate of thin films, and when the temperature is higher than 500° C., the thin film may be unnecessarily damaged. When the pressure is lower than 10 atm, there is a limit on improvement of the gas effect by high-pressure thermal treatment, and when the pressure is higher than 50 atm, the apparatus may be damaged or the thin film may also be unnecessarily damaged. Accordingly, the high-pressure thermal treatment is preferably carried out within the condition ranges. There is no particular limitation as to treatment time. However, when the time is less than 30 minutes, it is not long enough for the high-pressure thermal treatment to have an effect on the thin film, and when the time exceeds 3 hours, excessive high-pressure thermal treatment may cause deformation of the thin film. Accordingly, the treatment is preferably within the condition range.

Accordingly, the manufacturing method according to the present invention provides both high gas pressure and heat to the thin film by using high-pressure thermal treatment, instead of conventional barrier films having a multilayer or organic/inorganic hybrid structure for high WVTR, so that the density of the thin film can be improved and an even single thin film can exhibit excellent water vapor transmission rate (WVTR). In addition, after high-pressure thermal treatment, high transmittance (90% or more) suitable for the barrier film for solar cells can be secured.

Hereinafter, the following examples illustrate the invention and are not intended to limit the same.

EXAMPLE 1

Thin Film of PI Substrate (75 μm)/ZrO$_2$ (150 nm)/SiO$_2$ (10 nm)

A sample size was 4 cm*4 cm and an SiO$_2$ thin film was deposited to a thickness of 150 nm on a PI (polyimide) substrate of a thickness of 75 μm using an RF magnetron sputter apparatus under conditions of 5 mTorr, Ar 60 sccm, and O$_2$ partial pressure of 0% at a power of 150 W for 40 minutes, and a ZrO$_2$ thin film was deposited to a thickness of 10 nm thereon at a power of 150 W for 3 minutes. Then, to confirm high moisture resistance based on improvement of a defect density inside the thin film, high-pressure thermal treatment was performed using an O$_2$ gas at 300° C. and at 30 atm for one hour. The cross-sectional surface of the thin film thus produced is shown in FIG. 1(*a*).

EXAMPLE 2

Thin Film of PI Substrate (75 μm)/ZrO$_2$ (150 nm)/SiO$_2$ (10 nm)

A thin film was produced under the same conditions and in the same manner as in Example 1, except that High-pressure thermal treatment was performed using an N$_2$ gas at 300° C. and at 30 atm for one hour.

EXAMPLE 3

Thin Film of PI Substrate (75 μm)/Al$_2$O$_3$ (70 nm)

A sample size was 4 cm*4 cm and an Al$_2$O$_3$ thin film was deposited to a thickness of 70 nm on a PI substrate of a thickness of 75 μm using an ALD apparatus at 100° C. Then, high-pressure thermal treatment was performed using an O$_2$ gas at 30 atm at 50° C. The cross-sectional surface of the thin film thus produced is shown in FIG. 1(*b*).

EXAMPLE 4

Thin Film of PI Substrate (75 μm)/Al$_2$O$_3$ (70 nm)

A thin film was produced under the same conditions and in the same manner as in Example 3, except that high-pressure thermal treatment was performed using an N$_2$ gas at 50° C. and at 30 atm for one hour.

COMPARATIVE EXAMPLE 1

Thin Film of PI Substrate (75 μm)/ZrO$_2$ (150 nm)/SiO$_2$ (10 nm)

A thin film was produced under the same conditions and in the same manner as in Example 1, except that high-pressure thermal treatment was performed at 300° C. for one hour.

COMPARATIVE EXAMPLE 2:

Thin Film of PI Substrate (75 μm)/Al$_2$O$_3$ (70 nm)

A thin film was produced under the same conditions and in the same manner as in Example 3, except that high-pressure thermal treatment was performed at 300° C. for one hour.

TEST EXAMPLE 1

Measurement of Water Vapor Transmission Rate (WVTR)

Water vapor transmission rates (WVTR) of the thin films produced in Examples 1 to 4 and Comparative Examples 1 to 2 were measured by the following two methods and results are shown in the following Table 1.

Measurement of WVTR using a water vapor transmission rate measurement apparatus: WVTR was measured at a temperature of 37.8° C. and at a humidity of 100% using a MOCON apparatus.

Measurement using a Ca test method: WVTR was measured by a Ca test method of measuring the time during which a Ca metal pad was reacted with moisture and resistance reached 0. The Ca test method was carried out at a temperature of 85° C. and at a humidity of 85%. The measurement was carried out for a sample with a reduced size of 2 cm*2 cm.

TABLE 1

Results of measurement of water vapor transmission rate using measurement apparatus

| Type | | Gas | Pressure | Temperature | WVTR (g/m$^2$ * day) |
|---|---|---|---|---|---|
| PI/SiO$_2$/ZrO$_2$ | Example 1 | O$_2$ | 30 atm | 300° C. | 22.607 |
| PI/Al$_2$O$_3$ | Example 3 | O$_2$ | 30 atm | 50° C. | 5.931 |
| | Example 4 | N$_2$ | 30 atm | 50° C. | 0.377 |
| PI/SiO$_2$/ZrO$_2$ | Comparative Example 1 | — | — | 300° C. | 26.738 |
| PI/Al$_2$O$_3$ | Comparative Example 2 | — | — | 300° C. | 6.436 |

Example 1 in which high-pressure thermal treatment was performed using an O$_2$ gas on a PI/SiO$_2$/ZrO$_2$ thin film exhibited an increase in WVTR of 15.4%, as compared to Comparative Example 1.

In addition, Example 3 in which high-pressure thermal treatment was performed using an O$_2$ gas on a PI/Al$_2$O$_3$ thin film exhibited a great increase in WVTR, as compared to Comparative Example 2. Example 4 in which N$_2$ was used as inert gas exhibited a great increase in WVTR of 94% or higher, as compared to Example 3 using O$_2$.

In addition, comparing Example 4 with Comparative Example 2, it could be seen that improved WVTR could be obtained even at a relatively low temperature of 50° C., not at a conventional high thermal treatment temperature of 300° C.

Accordingly, the manufacturing method according to the present invention provides a barrier film having excellent moisture resistance even at a low process temperature.

TABLE 2

Results of measurement using Ca test method

| Type | Gas | Pressure | Temperature | WVTR (g/m$^2$ * day) |
|---|---|---|---|---|
| PI/Al$_2$O$_3$ | Example 4 | N$_2$ | 30 atm | 50° C. | 1.09 × 10$^{-2}$ |
| PI/Al$_2$O$_3$ | Comparative Example 2 | — | — | 300° C. | 9.12 × 10$^{-2}$ |

Example 4 using N$_2$ which is inert gas, exhibited an increase in WVTR of 88% or more, as compared to Comparative Example 2.

TEST EXAMPLE 2

Measurement of Transmittance

Figure 2A:
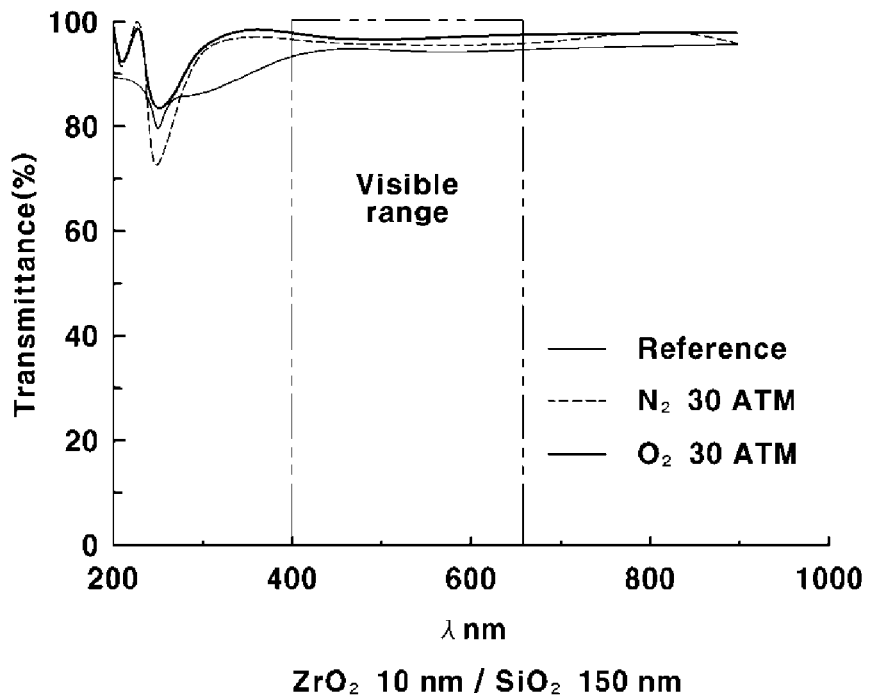
FIG. 2(a) is a graph showing transmittance of Examples 1 to 2 and Comparative Example 1.
Figure 2B:
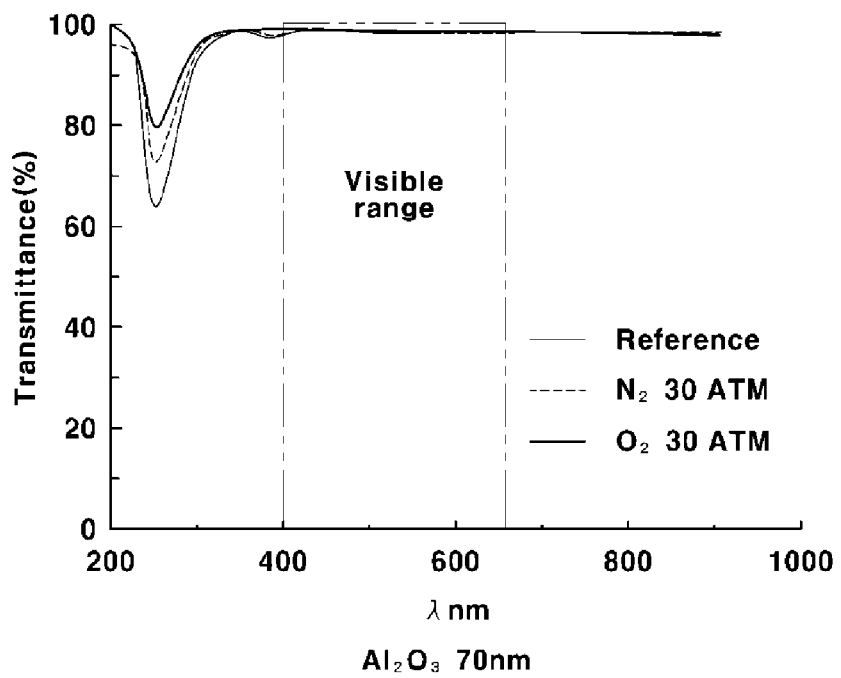
FIG. 2(b) is a graph showing transmittance of Examples 3 to 4 and Comparative Example 2.

In order for the thin films produced in Examples 1 to 4 and Comparative Examples 1 to 2 to secure film transmittance of 90% or more, transmittance depending on the wavelength region ranging from 200 to 900 nm was analyzed using a UV/VIS spectrophotometer (V-650). The sample used herein had a reduced size of 2 cm*2 cm. Furthermore, transmittance measurement results are shown in FIG. 2. FIG. 2 (a) shows transmittance measurement results of Examples 1 to 2 and Comparative Example 1, and FIG. 2(b) is a graph showing transmittance measurement results of Examples 3 to 4 and Comparative Example 2.

As can be seen from results shown in FIG. 2, Examples 1 to 4 according to the present invention satisfied transmittance of 90% or more in a visible light region even after high-pressure thermal treatment. Accordingly, it could be seen that high-pressure thermal treatment conditions did not affect transmittance in a visible light region.

Accordingly, with the manufacturing method according to the present invention, barrier films with excellent moisture resistance can be obtained even at a low process temperature by simultaneously applying thermal energy and pressure energy to oxide barrier films. Furthermore, flexible substrates used in conventional barrier films are deformed and deteriorated at high temperatures, whereas the present invention provides manufacture of barrier films at a relatively low temperature, thus enabling more free selection of flexible substrates for the barrier films and offering an extended application range of the flexible barrier film field.

As apparent from the foregoing, the method of manufacturing a barrier film according to the present invention is performed at a low cost by a low temperature process, as compared to a conventional method of manufacturing a barrier film using a thermal treatment process, thereby improving production efficiency, securing high transmittance of 90% or more within a visible light region and enhancing moisture resistance. Accordingly, the barrier film manufactured by the method is widely used as a barrier film for packaging solar cells.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method of manufacturing a barrier film with improved moisture resistance comprising:
   (a) forming an oxide thin film on a substrate by deposition; and
   (b) high-pressure thermal treating the oxide thin film using gas at a temperature of from about 50 to 500° C. and at a pressure of from about 20 to 50 atm, wherein the high-pressure thermal treatment of step (b) is carried out from about 30 minutes to 3 hours,
   wherein the oxide thin film is formed by sequentially depositing SiO$_2$ and ZrO$_2$ on the substrate by sputtering deposition.

2. A method of manufacturing a barrier film with improved moisture resistance comprising:
   (a) forming an oxide film on the substrate by deposition; and
   (b) high-pressure thermal treating the oxide thin film using gas at a temperature of from 50 to 500° C. and at a pressure of from about 20 to 50 atm, wherein the high-pressure thermal treatment of step (b) is carried out from about 30 minutes to 3 hours, wherein the oxide film is formed by depositing Al$_2$O$_3$ on the substrate by atomic layer deposition (ALD).

* * * * *